United States Patent
Jeon

(10) Patent No.: US 9,583,730 B2
(45) Date of Patent: *Feb. 28, 2017

(54) DISPLAY DEVICE INCLUDING A SEALING MEMBER AND METHOD OF MANUFACTURING THE SAME

(71) Applicant: Samsung Display Co., Ltd., Yongin, Gyeonggi-Do (KR)

(72) Inventor: Hee Chul Jeon, Hwaseong-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/466,504

(22) Filed: Aug. 22, 2014

(65) Prior Publication Data
US 2015/0125666 A1 May 7, 2015

(30) Foreign Application Priority Data
Nov. 1, 2013 (KR) .................. 10-2013-0132345

(51) Int. Cl.
| H01L 29/04 | (2006.01) |
| H01L 29/10 | (2006.01) |
| H01L 31/00 | (2006.01) |
| H01L 51/52 | (2006.01) |
| H01L 27/32 | (2006.01) |

(52) U.S. Cl.
CPC ...... *H01L 51/5246* (2013.01); *H01L 27/3244* (2013.01); *Y10T 428/24777* (2015.01)

(58) Field of Classification Search
CPC . H01L 51/52; H01L 27/3244; H01L 51/5246; G02F 1/1339; G02F 1/1345; G02F 1/136286

USPC .......................................... 257/296
See application file for complete search history.

(56) References Cited

U.S. PATENT DOCUMENTS

| 8,067,883 | B2 | 11/2011 | Wang |
| 8,564,198 | B2 | 10/2013 | Kim et al. |
| 8,994,909 | B2* | 3/2015 | Kira ............... G02F 1/1339 349/153 |
| 9,184,224 | B2* | 11/2015 | Lee ............... H01L 27/3276 |

(Continued)

FOREIGN PATENT DOCUMENTS

| JP | 2003-248214 A | 9/2003 |
| KR | 1999-0054225 A | 7/1999 |

(Continued)

*Primary Examiner* — John C Ingham
*Assistant Examiner* — Ismail Muse
(74) *Attorney, Agent, or Firm* — Knobbe Martens Olson & Bear LLP

(57) ABSTRACT

A display device and method of manufacturing the same are disclosed. In one aspect, the display device includes a substrate including a display area and a non-display area surrounding the display area. The display device also includes a first insulating layer formed in the non-display area, a first metal layer formed over the first insulating layer, and a second insulating layer formed over the first metal layer. A plurality of openings are formed in each of the first and second insulating layers and the first metal layer. The display device further includes a sealing member formed over the second insulating layer. The sealing member includes a plurality of coupling portions filling the openings and a groove is formed in a side wall of each of openings.

20 Claims, 9 Drawing Sheets

(56) References Cited

U.S. PATENT DOCUMENTS

| | | | |
|---|---|---|---|
| 2001/0045712 A1 | 11/2001 | Mathew et al. | |
| 2002/0131141 A1 | 9/2002 | Saitoh | |
| 2003/0090615 A1* | 5/2003 | Park | G02F 1/1339 349/153 |
| 2003/0197178 A1* | 10/2003 | Yamazaki | G02F 1/136227 257/59 |
| 2005/0285522 A1* | 12/2005 | Han | H01L 51/5246 313/512 |
| 2006/0221291 A1* | 10/2006 | Hong | G02F 1/1341 349/153 |
| 2007/0236643 A1* | 10/2007 | Fu | G02F 1/1339 349/153 |
| 2008/0150422 A1 | 6/2008 | OHara | |
| 2009/0231676 A1* | 9/2009 | Uchida | G02F 1/167 359/296 |
| 2010/0065852 A1* | 3/2010 | Lin | G02F 1/1345 257/72 |
| 2011/0058135 A1* | 3/2011 | Misaki | G02F 1/1339 349/153 |
| 2011/0127548 A1* | 6/2011 | Lee | H01L 51/5246 257/88 |
| 2012/0026074 A1 | 2/2012 | Lee et al. | |
| 2012/0153395 A1* | 6/2012 | Koezuka | H01L 27/1288 257/347 |
| 2012/0319123 A1* | 12/2012 | Han | H01L 51/5246 257/72 |
| 2012/0319574 A1* | 12/2012 | Kim | H01L 51/5246 313/512 |
| 2013/0026505 A1 | 1/2013 | Lee et al. | |

FOREIGN PATENT DOCUMENTS

| | | | |
|---|---|---|---|
| KR | 10-2000-0035044 A | 6/2000 | |
| KR | 10-2006-0104093 A | 10/2006 | |
| KR | 10-0688791 B1 | 2/2007 | |
| KR | 1020060008767 | * | 3/2007 |
| KR | 10-2009-0029441 A | 3/2009 | |
| KR | 10-2009-0041613 A | 4/2009 | |
| KR | 10-2011-0041321 A | 4/2011 | |
| KR | 10-2011-0059964 A | 6/2011 | |
| KR | 10-2012-0139075 A | 12/2012 | |
| KR | 10-2013-0014367 A | 2/2013 | |

* cited by examiner

DISPLAY DEVICE INCLUDING A SEALING MEMBER AND METHOD OF MANUFACTURING THE SAME

CROSS-REFERENCE TO RELATED APPLICATIONS

This application claims priority to and the benefit of Korean Patent Application No. 10-2013-0132345 filed in the Korean Intellectual Property Office on Nov. 1, 2013, the entire contents of which are incorporated herein by reference.

BACKGROUND

Field

The described technology generally relates to a display device and a method of manufacturing the same.

Description of the Related Technology

Examples of display devices include liquid crystal displays (LCDs), plasma display panels (PDPs), organic light-emitting diode (OLED) (OLED) displays, field effect displays (FEDs), electrophoretic displays, and the like.

OLED displays include two electrodes and an organic emission layer positioned therebetween. Electrons injected from one electrode and holes injected from the other are recombined with each other in the organic emission layer to generate excitons and the excitons emits energy in the form of light.

Since OLED displays have self-luminance characteristics, they do not require a separate light source and the thickness and weight thereof can be reduced. Further, since OLED displays have favorable characteristics such as low power consumption, high luminance, and a fast response speeds, OLED displays have been receiving attention as next-generation displays.

SUMMARY OF CERTAIN INVENTIVE ASPECTS

One inventive aspect is a display device having the advantages of preventing oxygen or moisture from permeating into a display panel due to weakened coupling force between a sealing member and a display substrate.

Another aspect is a method of manufacturing a display device having the advantages of firmly coupling a sealing member and a display substrate so as to prevent oxygen or moisture from permeating into a display panel.

Another aspect is a display device, including a substrate including a display area displaying an image and a non-display area positioned around the display area, a first insulating layer formed on the substrate of the non-display area, a first metal layer formed on the first insulating layer, a second insulating layer formed on the first metal layer, and a sealing member formed on the second insulating layer, in which a plurality of coupling portions are formed on the first and second insulating layers and the first metal layer, and a groove is formed at a side wall of the coupling portion.

The coupling portion may pass through the first and second insulating layers and the first metal layer.

One side cross section of the first and second insulating layers and one side cross section of the first metal layer which form the side wall of the coupling portion may form a step.

The first and second insulating layers and the first metal layer may be made of materials having different etching speeds.

The first metal layer may be made of a material having a faster etching speed than that of the first and second insulating layers.

The first insulating layer and the first metal layer may be alternated to form a plurality of layers.

Another aspect is a method of manufacturing a display device, including providing a substrate including a display area displaying an image and a non-display area positioned around the display area, forming a first insulating layer on the substrate of the non-display area, forming a first metal layer on the first insulating layer, forming a second insulating layer on the first metal layer, forming a photosensitive film pattern on the second insulating layer, forming a plurality of coupling portions corresponding to openings formed in the photosensitive film pattern at the first and second insulating layers and the first metal layer, forming a groove at a side wall of the coupling portions, removing the photosensitive film pattern, and forming a sealing member on the second insulating layer to fill the inside of the coupling portions.

The forming of the coupling portions may include a first etching process of etching the first and second insulating layers and the first metal layer by using the photosensitive film pattern as a mask.

The first etching process may be performed by dry etching.

The forming of the groove at the side wall of the coupling portions may include a second etching process of etching the side wall of the coupling portions.

The second etching process may be performed by wet etching.

The first metal layer may have a different etching speed from the first and second insulating layers.

The etching speed of the first metal layer is faster than that of the first and second insulating layers.

The first insulating layer and the first metal layer may be alternated to form a plurality of layers.

Another aspect is a display device including a substrate including a display area including a plurality of pixels and a non-display area surrounding the display area, a first insulating layer formed over the substrate in the non-display area, a first metal layer formed over the first insulating layer, a second insulating layer formed over the first metal layer, wherein a plurality of openings are formed in each of the first and second insulating layers and the first metal layer, and a sealing member formed over the second insulating layer and filled in the openings.

At least one groove is formed in a side wall of each of openings. The side wall of each of the coupling portions has a substantially step shape. The first and second insulating layers and the first metal layer are formed of materials having different etching speeds.

The second insulating layer is thicker than the first insulating layer and the first metal layer. The first metal layer is thicker than the first insulating layer.

According to at least one embodiment, since the sealing member and the display substrate are firmly attached to each other, it is possible to prevent oxygen or moisture from flowing into the display panel.

According to at least one embodiment, the coupling force between the sealing member and the display substrate is increased, and as a result, it is possible to prevent a seal from deteriorating due to external impact.

DETAILED DESCRIPTION OF CERTAIN INVENTIVE EMBODIMENTS

Figure 1:
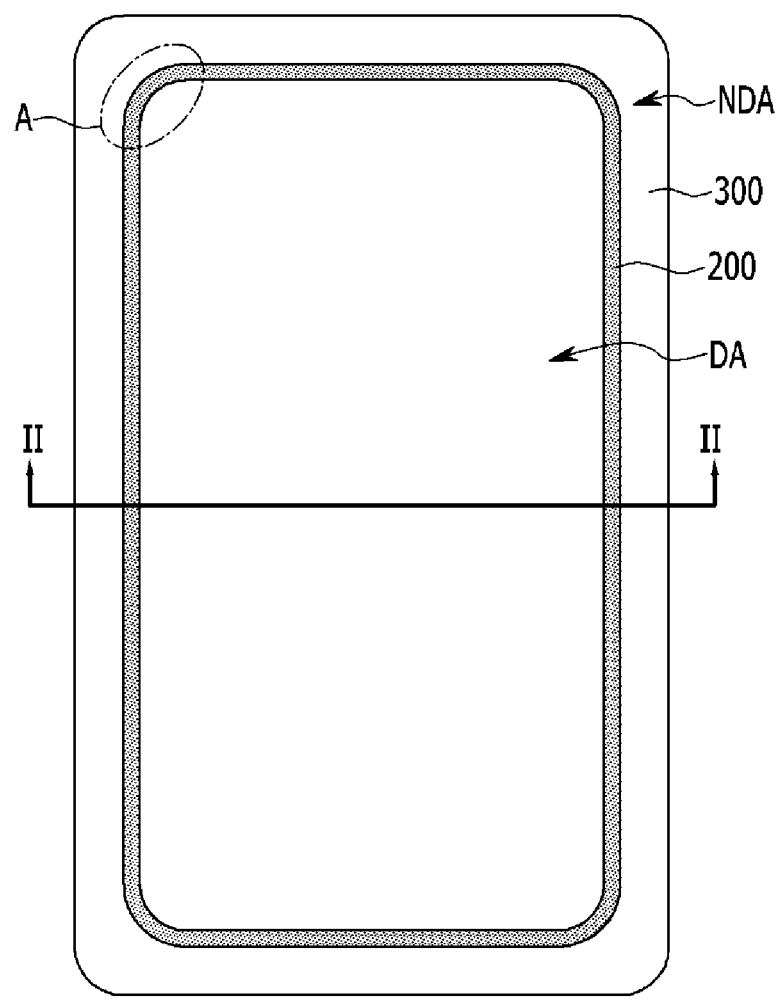
FIG. 1 is a schematic plan view of a display device with a sealing member.

Organic emission layers of OLED displays are vulnerable to environmental factors such as moisture, oxygen, and ultraviolet light, and thus, the sealing of these layers is very important. Generally, a display substrate is covered by a sealing substrate. A sealing member can be coated on the display substrate such that it and the sealing substrate are firmly affixed into a sealed structure. The force between the sealing member and the display substrate can deteriorate with aging, and thus, the sealing substrate loses its sealing capability. As a result, moisture or oxygen can permeate into the organic emission layer which is undesirable.

Hereinafter, exemplary embodiments of the described technology will be described in detail with reference to the accompanying drawings. As those skilled in the art would realize, the described embodiments may be modified in various different ways, all without departing from the spirit or scope of the described technology. The exemplary embodiments introduced herein are provided to make the disclosed contents thorough and complete and sufficiently transfer the spirit of the described technology to those skilled in the art.

In the drawings, the thicknesses of layers, films, panels, regions, etc., may be exaggerated for clarity. It will be understood that when a layer is referred to as being "on" another layer or substrate, it can be directly on the other layer or substrate, or intervening layers or components may also be present Like reference numerals designate like elements throughout the specification.

Figure 5:
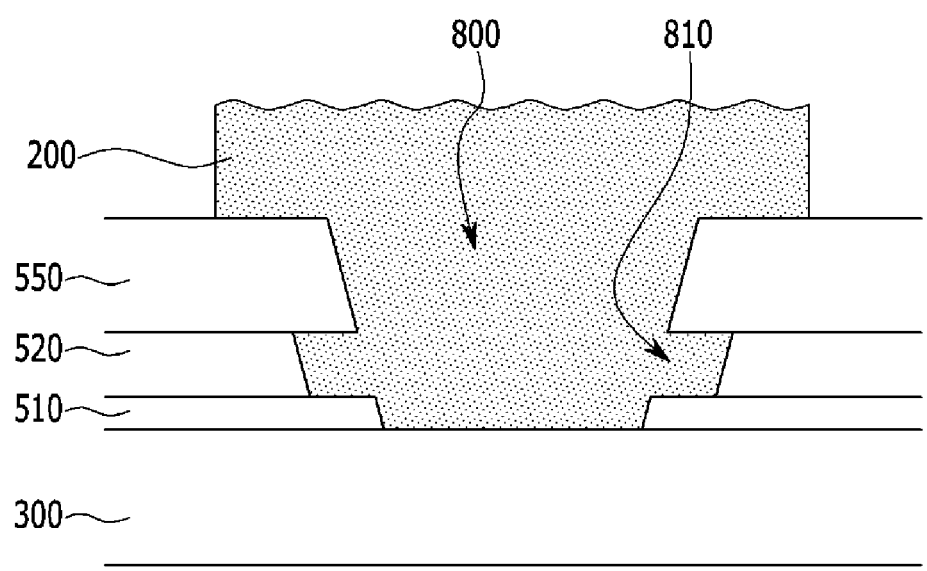
FIG. 5 is a cross-sectional view of the display device of FIG. 4 taken along line V-V.
Figure 6:
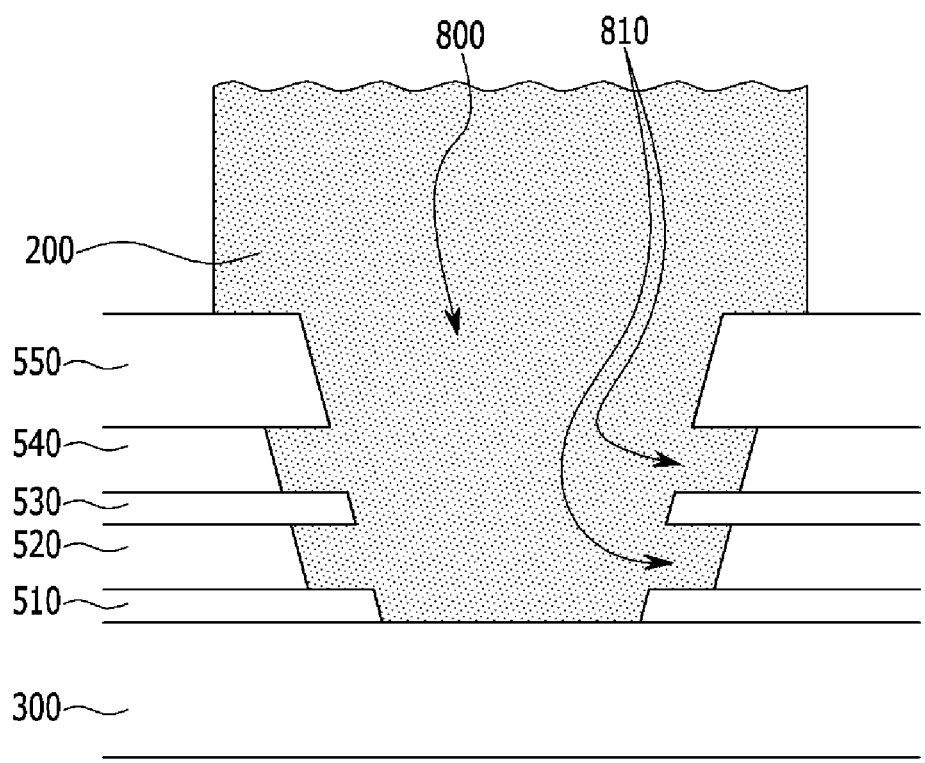
FIG. 6 is a cross-sectional view of a display device according to another exemplary embodiment.

Referring to FIGS. 5 and 6, a display device includes a plurality of coupling portions or plugs 800 formed on a substrate. As the contact area between the coupling portion 800 and a sealing member 200 increases, the coupling force between the sealing member 200 and the substrate 300 increases.

First, the structure of a display device according to an exemplary embodiment will be described with reference to FIGS. 1 to 3. The display device described with reference to FIG. 3 relates to an organic light-emitting diode (OLED) display.

Figure 2:
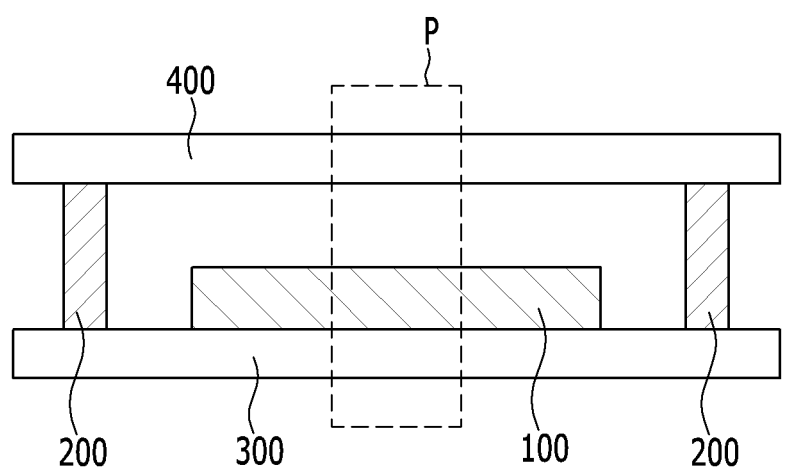
FIG. 2 is a cross-sectional view of FIG. 1 taken along line II-II.
Figure 3:
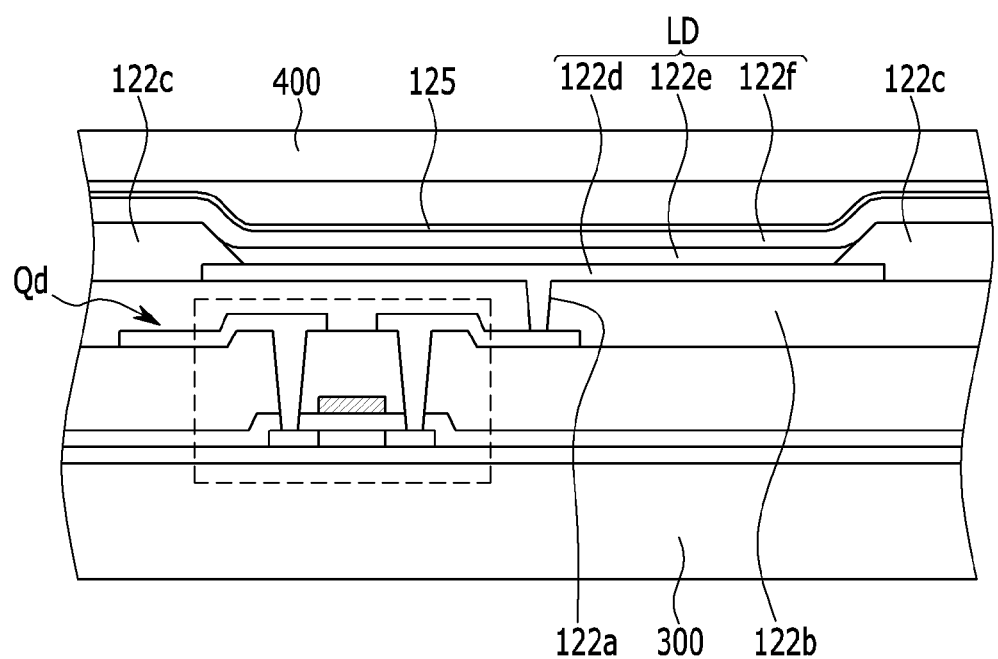
FIG. 3 is a cross-sectional view of an OLED display in which a region P of FIG. 2 is enlarged.

However, the display device is not limited to the embodiment of FIGS. 1 to 3. The described technology may be embodied as a liquid crystal display (LCD), a plasma display panel (PDP), a field effect display (FED), an electrophoretic display device, or the like.

Referring to FIG. 1, the OLED display includes a display area DA displaying an image and a non-display area NDA surrounding the display area. In the display area DA, a plurality of pixels and a driver driving the pixels are formed. The non-display area NDA represents the remaining area of the substrate excluding the pixels and the driver.

A sealing member 200 is formed on the boundary between the display area DA and the non-display area NDA. That is, the sealing member 200 is formed on the substrate 300 to surround a display panel 100 formed in the display area DA. The sealing member 200 couples the substrate 300 and a sealing substrate 400 to each other. A detailed description for the sealing member 200 will be described below.

Referring to FIG. 2, the display panel 100 is formed on the substrate 300 to display the image. In the embodiment of FIG. 2, the display panel 100 includes an organic emission layer.

The sealing substrate 400 sealing the display panel 100 is formed on the display panel 100. The sealing substrate 400 protects the display panel 100 from moisture, oxygen, and the like. Particularly, the sealing substrate 400 may prevent the organic emission layer included in the display panel 100 from deteriorating due to the penetration of moisture, oxygen, or the like.

According to the embodiment of FIG. 2, the sealing substrate 400 may be formed of various materials, for example, a glass material or a plastic material.

Meanwhile, the sealing member 200 is formed between the sealing substrate 400 and the substrate 300. In addition, the sealing member 200 is formed to surround the display panel 100.

The sealing member 200 firmly joins the sealing substrate 400 to the substrate 300. The sealing member 200 may be formed of a material containing frit. However, the sealing member 200 is not limited thereto, and may be formed of various known materials which can attach the sealing substrate 400 to the substrate 300.

FIG. 3 is a cross-sectional view of the OLED display of FIG. 2 in which region P is enlarged.

An embodiment of the display device will be described in detail with reference to FIG. 3.

Referring to FIG. 3, a driving transistor Qd is formed on a substrate 300 formed of transparent glass, plastic, or the like. The substrate 300 corresponds to the substrate 300 of FIG. 2.

A passivation layer 122$b$ including an inorganic material or an organic material is formed on the driving transistor Qd. When the passivation layer 122$b$ is formed of an organic material, the surface thereof may be substantially flat.

A via hole 122$a$ exposing a part of the driving transistor Qd is formed in the passivation layer 122$b$.

In addition, a first electrode 122$d$ is formed on the passivation layer 122$b$. The first electrode 122$d$ may include a reflective electrode and a transparent electrode formed thereon. The reflective electrode may be formed of a metal having a high reflectivity such as silver (Ag) or aluminum (Al), an alloy thereof, or the like, and the transparent electrode may be formed of transparent conductive oxide such as indium tin oxide (ITO) or indium zinc oxide (IZO), or the like.

In the embodiment of FIG. 3, a pixel defining layer 122$c$ covering a periphery of the first electrode 122$d$ is formed on the passivation layer 122$b$.

Moreover, an organic emission layer 122$e$ is formed on the first electrode 122$d$. In addition, a second electrode 122$f$ is formed on the organic emission layer 122$e$ and the pixel defining layer 122$c$.

The organic emission layer 122$e$ may further include organic layers (not illustrated) for efficiently transferring carriers of holes or electrons to the emission layer in addition to the emission layer (not illustrated). The organic layers may be a hole injection layer and a hole transporting layer formed between the first electrode 122$d$ and the emission layer, and an electron injection layer and an electron transporting layer formed between the second electrode 122f and the emission layer.

Further, a capping layer 125 covering and protecting the second electrode 122f may be formed on the second electrode 122f as an organic layer.

In addition, the sealing substrate 400 may be spaced apart from the capping layer 125.

As shown in FIG. 3, the display panel 100 includes a number of layers formed between the substrate 300 and the sealing substrate 400.

Figure 4:
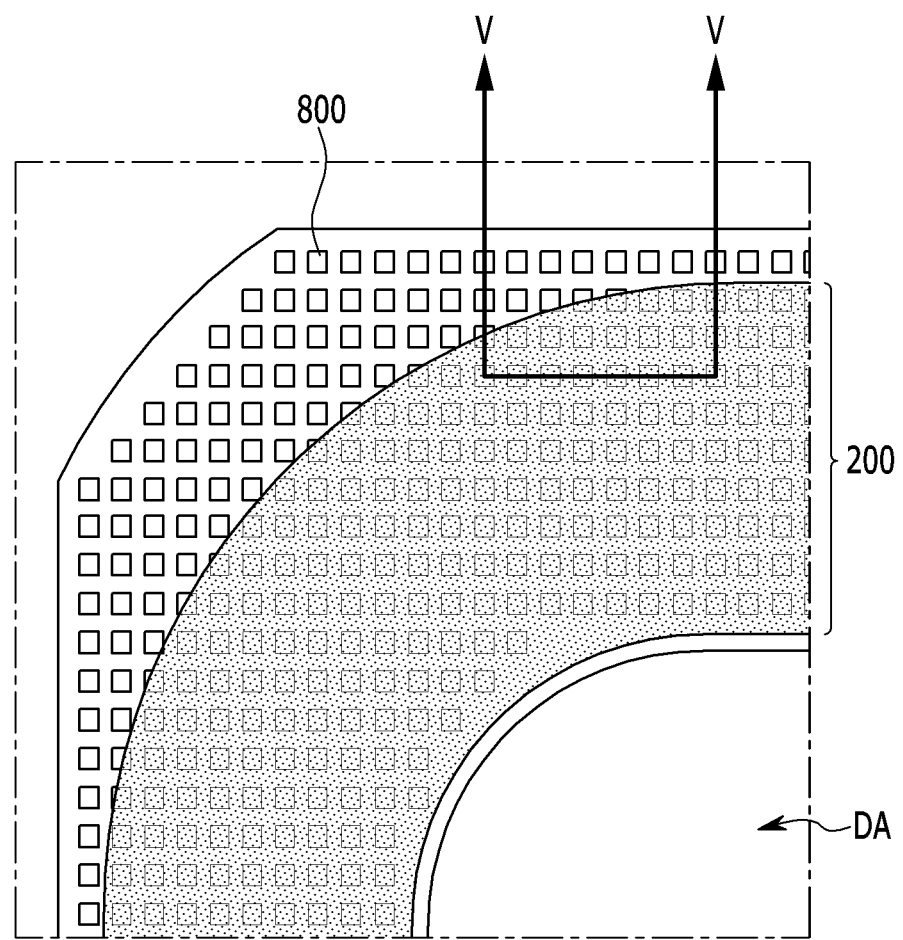
FIG. 4 is an enlarged view of region A of FIG. 1.

According to the embodiment of FIG. 3, the coupling portion 800 is formed at a position corresponding to the sealing member 200 on the substrate 300. Referring to FIG. 4, the coupling portion 800 may be formed to have a plurality of grooves at an insulating layer and a metal layer on the substrate 300.

The insulating layer and the metal layer of the display device will be described prior to a detailed description of the coupling portion 800.

Referring to FIG. 5, a first insulating layer 510 is formed on the substrate 300.

The first insulating layer 510 may be a single layer or a multilayer including at least one of tetra ethyl ortho silicate (TEOS), silicon nitride (SiNx), or silicon oxide (SiO$_2$).

Additionally, other layers may be formed between the substrate 300 and the first insulating layer 510, however, a detailed description thereof will be omitted.

According to the embodiment of FIG. 5, the first insulating layer 510 formed in the non-display area NDA corresponds to a gate insulating layer of the display area DA. That is, the first insulating layer 510 may be formed on the same layer as the gate insulating layer. In some embodiments, the first insulating layer 510 is formed of the same material as the gate insulating layer and in the same process as forming the gate insulating layer.

Additionally, a first metal layer 520 may be formed on the first insulating layer 510. The first metal layer 520 may be formed in a single layer or a multilayer of Al, Ti, Mo, Cu, Ni, or an alloy thereof.

In addition, the first metal layer 520 may correspond to a gate electrode formed in the display area DA. That is, the first metal layer 520 may be formed on the same layer as the gate electrode. In some embodiments, the first metal layer 520 is formed of the same material as the gate electrode and in the same process as forming the gate electrode.

A second insulating layer 550 is formed on the first metal layer 520. Similar to the first insulating layer 510, the second insulating layer 550 may be formed as a single layer or a multilayer including at least one of tetra ethyl ortho silicate (TEOS), silicon nitride (SiNx), or silicon oxide (SiO2).

The second insulating layer 550 may correspond to an interlayer insulating layer formed in the display area DA. That is, the second insulating layer 550 may be formed on the same layer as the interlayer insulating layer. In some embodiments, the second insulating layer 550 is formed of the same material as the interlayer insulating layer and in the same process as forming the interlayer insulating layer.

Referring to FIG. 5, the sealing member 200 is formed on the second insulating layer 550. The sealing member 200 surrounds the display panel 100 (see FIG. 2) as described above.

The sealing member 200 is formed on the substrate 300 and fills the coupling portion 800 formed in the first and second insulating layers 510 and 550 and the first metal layer 520. According to some embodiments, the sealing member 200 includes the coupling portions 800. In these embodiments, the coupling portions 800 fill openings formed in the first and second insulating layers 510 and 550 and the first metal layer 520.

According to the embodiment of FIG. 5, the coupling portions 800 are formed to have a groove shape.

Referring to FIGS. 4 and 5, the coupling portion 800 is formed through the first and second insulating layers 510 and 550 and the first metal layer 520. However, in some embodiments, the coupling portion 800 does not pass through the first insulating layer 510 formed below the first metal layer 520 and is formed in the shape of groove in which only a part of the first insulating layer 510 is etched.

The coupling portion 800 is formed by etching the first and second insulating layers 510 and 550 and the first metal layer 520. That is, the coupling portion 800 is formed on the second insulating layer 550 by forming and then etching a photosensitive film pattern having a plurality of openings. A detailed description thereof will be described below in a method of manufacturing a display device which is an exemplary embodiment.

Furthermore, as illustrated in FIG. 5, a groove 810 is formed on a side wall of the coupling portion 800. The groove 810 of the coupling portion 800 is formed so that a step of a larger diameter or cross section is formed in the first and second insulating layers 510 and 550 and the first metal layer 520 when viewed as a cross section.

That is, the first and second insulating layers 510 and 550 and the first metal layer 520 do not form a continuous surface when viewed as a cross section. Consequently, the coupling portion 800 is formed in the shape of a step.

As shown in the cross section of FIG. 5, of the first and second insulating layers 510 and 550 protrudes farther to the inside of the coupling portion 800 than the first metal layer 520, and as a result, the coupling portion 800 has a groove shape.

According to other embodiments, the first metal layer 520 protrudes farther to the inside of the coupling portion 800 than the first and second insulating layers 510 and 550, and as a result, the coupling portion 800 has a groove shape.

As such, a groove 810 is formed at the side wall of the coupling portion 800, and as a result, the contact area between the sealing member 200 and the coupling portion 800 increases. Accordingly, the coupling force between the sealing member 200 and the first and second insulating layers 510 and 550, and the first metal layer 520 increases.

The groove 810 of the coupling portion 800 may be formed by an additional etching process after forming the coupling portion 800. For example, the groove 810 may be formed by wet etching, after forming the coupling portion 800.

The first and second insulating layers 510 and 550 and the first metal layer 520 may be formed of materials having different etching speeds. When the layers are formed of materials having different etching speeds, during wet etching, as described above, the first and second insulating layers 510 and 550 and the first metal layer 520 make a step to form a groove.

When the first metal layer 520 is formed of a material having a faster etching speed than each of the first and second insulating layers 510 and 550, the first metal layer 520 is etched more than the first and second insulating layers 510 and 550 during wet etching. Accordingly, as illustrated in FIG. 5, the groove 810 may be formed in the coupling portion 800.

Alternately, when the first and second insulating layers 510 and 550 are formed of a material having a faster etching speed than the first metal layer 520, the first and second insulating layers 510 and 550 are etched more than the first metal layer 520. As a result, the groove is formed with recesses in each of the first and second insulating layers 510 and 550.

According to some embodiments, the first insulating layer 510 and the first metal layer 520 of FIG. 5 are alternated to form a plurality of layers. For example, as illustrated in FIG. 6, a third insulating layer 530 and a second metal layer 540 are additionally formed between the first metal layer 520 and the second insulating layer 550.

Referring to FIG. 6, the third insulating layer 530 is formed of the same material as the first or second insulating layer 510 or 550. That is, the third insulating layer 530 may be a single layer or a multilayer including at least one of tetra ethyl ortho silicate (TEOS), silicon nitride (SiNx), or silicon oxide (SiO2).

In some embodiments, the third insulating layer 530 corresponds to a gate insulating layer formed in the display area DA. The gate insulating layer formed in the display area DA may be formed as a plurality of layers, and the third insulating layer 530 may be formed on the same layer as a gate insulating layer which is different from the gate insulating layer corresponding to the first insulating layer 510.

Meanwhile, the second metal layer 540 may be formed of the same material as the first metal layer 520. That is, the second metal layer 540 may be formed in a single layer or a multilayer of Al, Ti, Mo, Cu, Ni, or an alloy thereof.

The second metal layer 540 may correspond to a gate electrode formed in the display area DA. The gate electrode formed in the display area DA may be formed as a plurality of layers and the second metal layer 540 may be formed on the same layer as a gate electrode which is different from the gate electrode corresponding to the first metal layer 520.

In addition, as illustrated in FIG. 6, the third insulating layer 530 and the second metal layer 540 are etched to form the coupling portion 800. The etching speeds of the third insulating layer 530 and the second metal layer 540 are respectively the same as the first insulating layer 510 and the first metal layer 520 and a detailed description thereof will be omitted.

Figure 7:
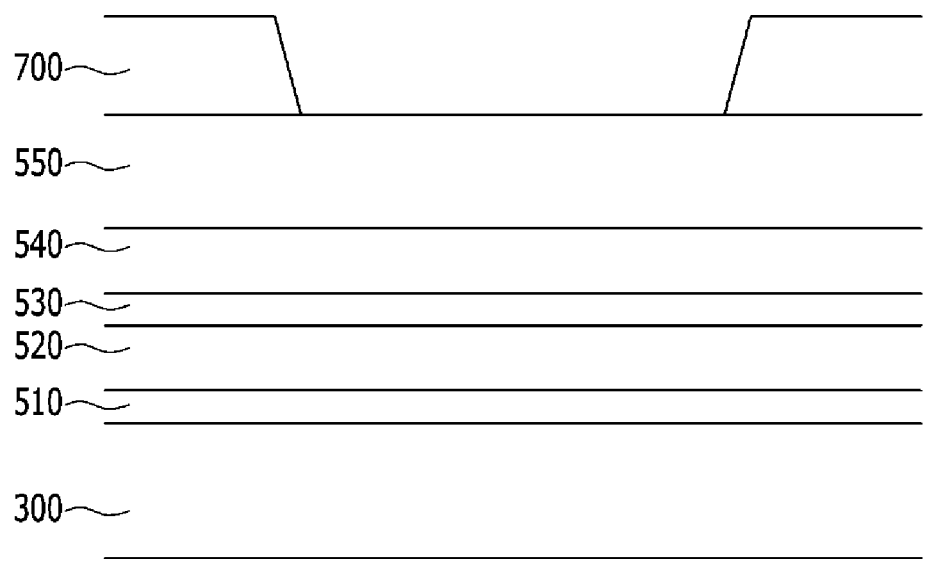
FIGS. 7 to 9 are manufacturing processes of a display device according to an exemplary embodiment.
Figure 8:
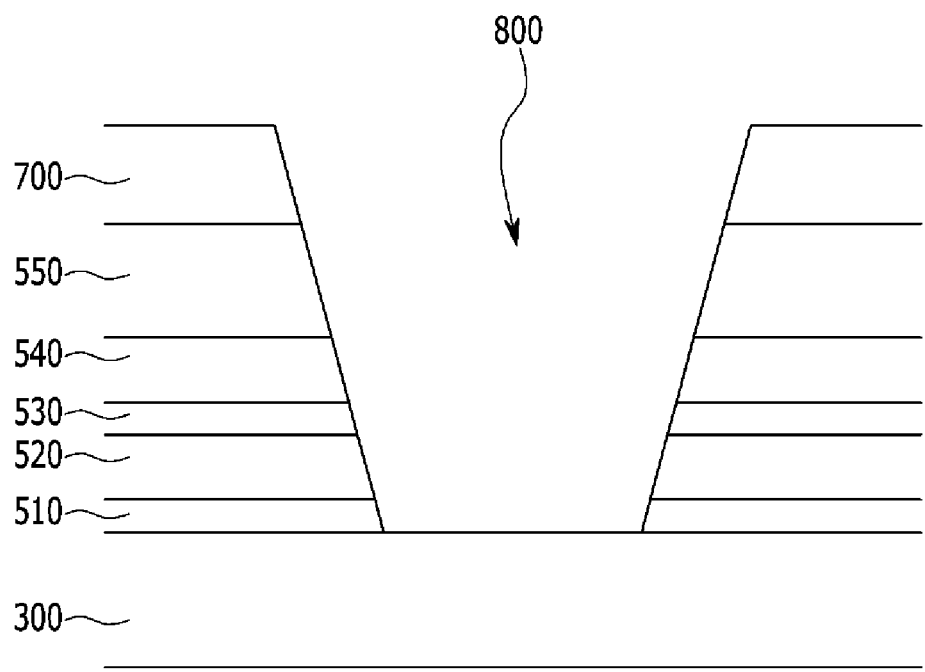
Figure 9:
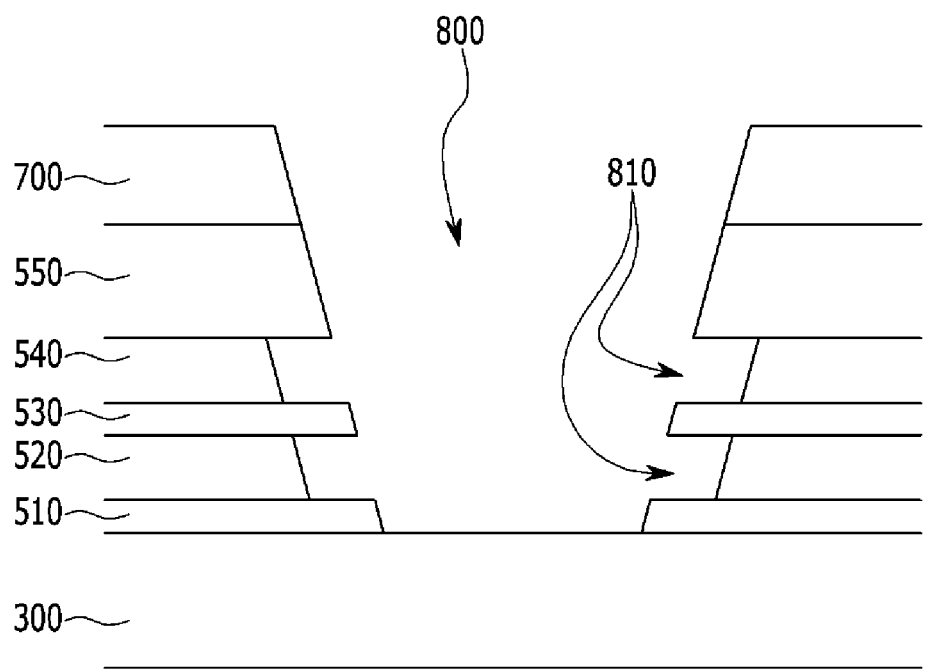

Hereinafter, a method of manufacturing the display device described above will be described with reference to FIGS. 7 to 9. FIGS. 7 to 9 illustrate manufacturing processes of the display device according to an exemplary embodiment.

Referring to FIG. 7, the first insulating layer 510, the first metal layer 520, third insulating layer 530, the second metal layer 540, and the second insulating layer 550 are sequentially formed on the substrate 300.

The first to third insulating layers 510, 550, and 530 may be formed of tetra ethyl ortho silicate (TEOS), silicon nitride (SiNx), or silicon oxide (SiO$_2$) as described above. The first to third insulating layers 510, 550, and 530 may be formed by using chemical vapor deposition, spin coating, or the like.

Further, the first and second metal layers 520 and 540 may be formed of Al, Ti, Mo, Cu, Ni, or an alloy thereof. The first and second metal layers 520 and 540 may be formed by using a vacuum deposition method. For example, the first and second metal layers 520 and 540 may be formed through a sputtering method of the vacuum deposition method.

Next, a photosensitive film pattern 700 is formed on the second insulating layer 550. A plurality of openings corresponding to the coupling portions 800 are formed in the photosensitive film pattern 700. The photosensitive film pattern 700 may be used as a mask when the coupling portions 800 are formed.

Next, as illustrated in FIG. 8, the coupling portion 800 is formed by etching the first to third insulating layers 510, 550, and 530 and the first and second metal layers 520 and 540 by using the photosensitive film pattern 700 as a mask.

The etching process for forming the coupling portion 800 may be dry etching. The dry etching may be performed by using etching gas capable of simultaneously etching the first to third insulating layers 510, 550, and 530 and the first and second metal layers 520 and 540.

The side wall of the coupling portion 800 may be formed to be inclined at a predetermined angle with respect to the upper surface of the substrate 300, in order to increase a contact area.

Next, as illustrated in FIG. 9, the groove 810 is formed at the side wall of the coupling portion 800. The groove 810 formed at the side wall of the coupling portion 800 may be formed by an etching process.

The etching process for forming the groove 810 of the coupling portion 800 may be wet etching.

According to at least one embodiment, the wet etching process is performed by differentially etching the first to third insulating layers 510, 550, and 530 and the first and second metal layers 520 and 540.

In more detail, wet etching may be performed while an etchant used in the wet etching process has different etching ratios for the first to third insulating layers 510, 550, and 530 and the first and second metal layers 520 and 540.

In some embodiments, the etching speed of the first and second metal layers 520 and 540 is faster than the etching speed of the first to third insulating layers 510, 550, and 530. As a result, the first and second metal layers 520 and 540 are etched more than the first to third insulating layers 510, 550, and 530 forming the groove at the side wall of the coupling portion 800 as illustrated in FIG. 9.

In other embodiments, the etching speed of the first to third insulating layers 510, 550, and 530 is faster than the etching speed of the first and second metal layers 520 and 540. As a result, the first to third insulating layers 510, 550, and 530 are etched more than the first and second metal layers 520 and 540, and thus the first and second metal layers 520 and 540 protrude farther to the inside of the coupling portion 800 than the first to third insulating layers 510, 550, and 530 to form the groove.

Next, as illustrated in FIG. 6, the sealing member 200 is formed after removing the photosensitive film pattern 700. The sealing member 200 is formed on the second insulating layer 550 while filling the inside of the coupling portion 800.

The sealing member 200 is then cured and formed by laser exposure, after injecting a frit into the coupling portion 800. The frit is coated on the second insulating layer 550 to fill the inside of the coupling portion 800, the sealing substrate 400 is laminated on the frit, and then the substrate 300 and the sealing substrate 400 are attached to each other by laser irradiation.

According to at least one embodiment, the display device may substantially prevent oxygen or moisture from permeating into the display panel by forming the coupling portion having a large contact area on the substrate to firmly attach the sealing member to the display substrate.

While the described technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
   a substrate including a display area and a non-display area surrounding the display area;
   a first insulating layer formed in the non-display area;
   a first metal layer formed over the first insulating layer;
   a second insulating layer formed over the first metal layer, wherein a plurality of openings are formed in each of i) the first and second insulating layers and ii) the first metal layer; and
   a sealing member formed over the second insulating layer, wherein the sealing member comprises a plurality of coupling portions filling the openings,
   wherein a groove is formed in a side wall of each of openings, and
   wherein each of the first and second insulating layers protrudes farther towards the center of each of the openings than the first metal layer.

2. The display device of claim 1, wherein each of the coupling portions passes through the first and second insulating layers and the first metal layer.

3. The display device of claim 1, wherein the side wall of each of the coupling portions has a substantially step shape.

4. The display device of claim 1, wherein the first and second insulating layers and the first metal layer are formed of materials having different etching speeds.

5. The display device of claim 4, wherein the first metal layer has a faster etching speed than each of the first and second insulating layers during wet etching.

6. The display device of claim 1, further comprising:
   a third insulting layer formed over the first metal layer; and
   a second metal layer formed between the third insulating layer and the second insulating layer,
   wherein the third insulating layer is formed of the same material as the first insulating layer, and
   wherein the second metal layer is formed of the same material as the first metal layer.

7. A method of manufacturing a display device, comprising:
   providing a substrate including a display area and a non-display area surrounding the display area;
   forming a first insulating layer over the substrate in the non-display area;
   forming a first metal layer over the first insulating layer;
   forming a second insulating layer over the first metal layer;
   forming a photosensitive film pattern over the second insulating layer, wherein a plurality of first openings are defined in the photosensitive film pattern;
   forming a plurality of second openings corresponding to the first openings, wherein each of the first and second openings passes through each of the first and second insulating layers and the first metal layer;
   forming a groove at a side wall of each of the second openings, wherein each of the first and second insulating layers protrudes farther towards the center of each of the second openings than the first metal layer;
   removing the photosensitive film pattern; and
   filling the second openings so as to form a plurality of coupling portions.

8. The method of claim 7, wherein the forming of the second openings comprises first etching the first and second insulating layers and the first metal layer with the photosensitive film pattern as a mask.

9. The method of manufacturing a display device of claim 8, wherein the first etching comprises dry etching.

10. The method of manufacturing a display device of claim 8, wherein the forming of the groove comprises second etching the side wall of each of the second openings.

11. The method of manufacturing a display device of claim 10, wherein the second etching comprises wet etching.

12. The method of manufacturing a display device of claim 11, wherein the first metal layer has a different etching speed from each of the first and second insulating layers.

13. The method of manufacturing a display device of claim 12, wherein the etching speed of the first metal layer is faster than that of each of the first and second insulating layers during wet etching.

14. The method of manufacturing a display device of claim 7, further comprising:
   forming a third insulating layer over the first metal layer; and
   forming a second metal layer over the third insulating layer,
   wherein the second metal layer is formed between the third insulating layer and the second insulating layer.

15. A display device, comprising:
   a substrate comprising a display area including a plurality of pixels and a non-display area surrounding the display area;
   a first insulating layer formed over the substrate in the non-display area;
   a first metal layer formed over the first insulating layer;
   a second insulating layer formed over the first metal layer, wherein a plurality of openings are formed in each of i) the first and second insulating layers and ii) the first metal layer; and
   a sealing member formed over the second insulating layer and filled in the openings,
   wherein each of the first and second insulating layers protrudes farther towards the center of each of the openings than the first metal layer.

16. The display device of claim 15, wherein at least one groove is formed in a side wall of each of openings.

17. The display device of claim 15, wherein the side wall of each of the coupling portions has a substantially step shape.

18. The display device of claim 15, wherein the first and second insulating layers and the first metal layer are formed of materials having different etching speeds.

19. The display device of claim 15, wherein the second insulating layer is thicker than the first insulating layer and the first metal layer.

20. The display device of claim 19, wherein the first metal layer is thicker than the first insulating layer.

* * * * *